US012272995B2

United States Patent
Sykora et al.

(10) Patent No.: US 12,272,995 B2
(45) Date of Patent: Apr. 8, 2025

(54) PERMANENT MAGNET MOTOR HARMONIC FILTER

(71) Applicant: Trane International Inc., Davidson, NC (US)

(72) Inventors: Benjamin J. Sykora, Stoddard, WI (US); Seth M. McGill, Brookings, SD (US); Petri J. Mäki-Ontto, Espoo (FI)

(73) Assignee: Trane International Inc., Davidson, NC (US)

( * ) Notice: Subject to any disclaimer, the term of this patent is extended or adjusted under 35 U.S.C. 154(b) by 979 days.

(21) Appl. No.: 16/853,372

(22) Filed: Apr. 20, 2020

(65) Prior Publication Data

US 2021/0328481 A1   Oct. 21, 2021

(51) Int. Cl.
*H02K 11/02* (2016.01)
*H02K 1/276* (2022.01)
(Continued)

(52) U.S. Cl.
CPC ........... *H02K 11/02* (2013.01); *H02K 1/2766* (2013.01); *H02K 1/278* (2013.01); *H02K 9/19* (2013.01);
(Continued)

(58) Field of Classification Search
CPC .......... H02K 11/02; H02K 9/19; H02K 21/14; H02K 1/12; H02K 1/2766; H02K 1/278;
(Continued)

(56) References Cited

U.S. PATENT DOCUMENTS

| 5,119,466 | A |   | 6/1992 | Suzuki |
| 5,530,307 | A | * | 6/1996 | Horst .................... H02K 21/14 |
|           |   |   |        | 174/DIG. 19 |
| 6,069,431 | A | * | 5/2000 | Satoh ...................... H02K 1/02 |
|           |   |   |        | 310/43 |

(Continued)

FOREIGN PATENT DOCUMENTS

| CA | 2926265    |   | 4/2015 |
| CN | 102315739  | * | 1/2012 |

(Continued)

OTHER PUBLICATIONS

Surface roughness; https://www.intelligentactuator.com/technical-reference-surface-roughness/ (Year: 1994).*

(Continued)

*Primary Examiner* — Ahmed Elnakib
(74) *Attorney, Agent, or Firm* — Womble Bond Dickinson (US) LLP

(57) ABSTRACT

Architectures or techniques are presented that can improve operation of permanent magnet (PM) motors, which can be part of a compressor or other heating, ventilation, and air conditioning (HVAC) device. Such improvements can be achieved by integration of inductive filtering into the motor assembly. A higher overall inductance can reduce current ripple and can further result in a lower total harmonic distortion, reduced power loss, and reduced heat generated. For example a first architecture can include a ferromagnetic core element in the PM motor that can cause a non-torque-producing reluctance path to the shaft. A second architecture can integrate a signal filter, which is customarily external, into a housing of the PM motor. Such can significant reduce costs and provide other advantages. A third architecture can couple an inductor (e.g., of the signal filter) to the shaft. Rotation of the shaft can thus serve to provide additional cooling for the inductor.

18 Claims, 9 Drawing Sheets

*CROSS-SECTION PERSPECTIVE VIEW*

EXAMPLE PM MOTOR HAVING CORE ELEMENT THAT CAN PROVIDE A
NON-TORQUE PRODUCING RELUCTANCE PATH TO SHAFT 208

(51) Int. Cl.
*H02K 1/278* (2022.01)
*H02K 9/19* (2006.01)
*H02K 21/14* (2006.01)
*H03H 1/00* (2006.01)

(52) U.S. Cl.
CPC .......... *H02K 21/14* (2013.01); *H03H 1/0007* (2013.01); *H03H 2001/0092* (2013.01)

(58) Field of Classification Search
CPC ...... H02K 1/06; H02K 2201/03; H02K 29/03; H02K 7/14; H03H 1/0007; H03H 2001/0092
USPC .......................................................... 310/54
See application file for complete search history.

(56) References Cited

U.S. PATENT DOCUMENTS

| | | | |
|---|---|---|---|
| 6,611,071 B2 | 8/2003 | Stauder et al. | |
| 6,989,620 B2 | 1/2006 | Nilson | |
| 7,710,081 B2 | 5/2010 | Saban et al. | |
| 7,932,658 B2 | 4/2011 | Ionel | |
| 8,072,113 B2 | 12/2011 | Dooley et al. | |
| 8,269,390 B2 | 9/2012 | Sakai et al. | |
| 9,115,707 B2 | 8/2015 | Hattori et al. | |
| 9,613,745 B2 | 4/2017 | Shudarek | |
| 10,797,546 B2 | 10/2020 | Lee | |
| 10,811,941 B2* | 10/2020 | Andersson | H02K 1/12 |
| 2005/0269888 A1 | 12/2005 | Utaka | |
| 2006/0028082 A1 | 2/2006 | Asagara et al. | |
| 2008/0239776 A1 | 10/2008 | Mance et al. | |
| 2013/0270961 A1 | 10/2013 | Chu | |
| 2013/0293047 A1 | 11/2013 | Nagasaka et al. | |
| 2014/0191624 A1 | 7/2014 | Jahshan | |
| 2015/0054389 A1* | 2/2015 | Filatov | F16C 32/0465 310/68 B |
| 2015/0214798 A1* | 7/2015 | Tajima | H02K 29/03 310/156.19 |
| 2017/0163106 A1* | 6/2017 | Jassal | H02K 1/246 |

FOREIGN PATENT DOCUMENTS

| | | | |
|---|---|---|---|
| CN | 102315739 A | | 1/2012 |
| CN | 108539955 A | | 9/2018 |
| EP | 1444765 B1 | | 8/2007 |
| EP | 2 611 006 A2 | | 4/2012 |
| EP | 2611006 | * | 7/2013 |
| JP | 2002136012 A | | 5/2002 |
| WO | 2003055042 A1 | | 7/2003 |

OTHER PUBLICATIONS

JP 2001339886; Koji et al. (Year: 2001).*
CN 1250553 for Shiichiro, Kawano et al. (Year: 2000).*
JP 2009124899 for Shichijo Akichika et al. (Year: 2009).*
"Stator flux barriers to improving interior permanent magnet motor characteristics; Irasari and P Widiyanto 2021 IOP Conf. Ser.: Earth Environ. Sci. 927 012040" (Year: 2021).*
"Impact of Rotor Flux-Barriers on Coupling Coefficient in a Brushless Doubly-Fed Reluctance Machine," in IEEE Transactions on Energy Conversion, vol. 38, No. 2, pp. 927-938, Jun. 2023, doi: 10.1109/TEC.2022.3230628. (Year: 2023).*
Khowja Muhammad Raza and Gerada, Clare and Vakil Gaurang and Wheeler P. and Patel Chintanbai; Novel integrative options for passive filter inductor in high speed AC drives; The 42nd Annual Conference of IEEE Industrial Electronics Society, Oct. 2016.
Khowja Muhammad Raza and Gerada, C. and Vakil, Gaurang and Patel, Chintanbai and Wheeler Patrick; Design optimization of integrated rotor-less inductors for high-speed AC drive applications; IEEE Workshop on Electrical Machines Design, Control and Diagnosis (WEMDCD 2017); Apr. 20-21, 2017.
International Search Report in the corresponding International Application No. PCT/IB2021/053180, mailed Jul. 23, 2021.
International Preliminary Report on Patentability for International Application No. PCT/IB2021/053180, mailed Aug. 24, 2022, 49 pages.

* cited by examiner

PERMANENT MAGNET MOTOR HARMONIC FILTER

TECHNICAL FIELD

The present disclosure is directed to permanent magnet (PM) motors such as surface permanent magnet (SPM) motors or interior permanent magnet (IPM) motors, which can be included in compressors or other heating, ventilation, and air conditioning (HVAC) devices, and more particularly to PM motors with harmonic filtering that can improve efficiency, performance, or the like.

BACKGROUND

Today, permanent magnet (PM) motors are widely used throughout the world and have a variety of applications. One example application is using a PM motor to drive a compressor in a heating, ventilation, and air conditioning (HVAC) system

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

According to an embodiment of the present disclosure, an apparatus, such as, e.g., a motor apparatus, can comprise a housing of a permanent magnet (PM) motor. The PM motor (and by proxy the housing) can comprise a stator, a rotor, and a permanent magnet coupled to an outer surface of the rotor. Thus, the permanent magnet can be situated between the stator and the rotor. The PM motor can further comprise a shaft, extending through an opening in the rotor, that rotates in unison with the rotor. Advantageously, the apparatus and/or the PM motor can further comprise a core element composed of a ferromagnetic material. The core element can be configured to cause a reluctance path to the shaft during operation of the PM motor.

According to an embodiment of this disclosure, the housing of apparatus (and/or the PM motor) can comprise a signal filter device, which can result in a number of advantages over previous designs in which a filter device is external to an HVAC compressor or motor.

According to an embodiment of this disclosure, an inductor (e.g., a toroidal inductor) of the signal filter device can be mounted around a shaft of the PM motor. Advantageously, rotation of the shaft can affect cooling of the inductor.

According to an embodiment of this disclosure, the motor can be substantially any type of permanent magnet (PM) motor, such as an SPM motor or an interior permanent magnet (IPM) motor.

In some embodiments, elements described in connection with the systems or apparatuses above can be embodied in different forms such as a method of fabricating they system or apparatus, or another suitable form.

DETAILED DESCRIPTION

Overview

Figure 1:
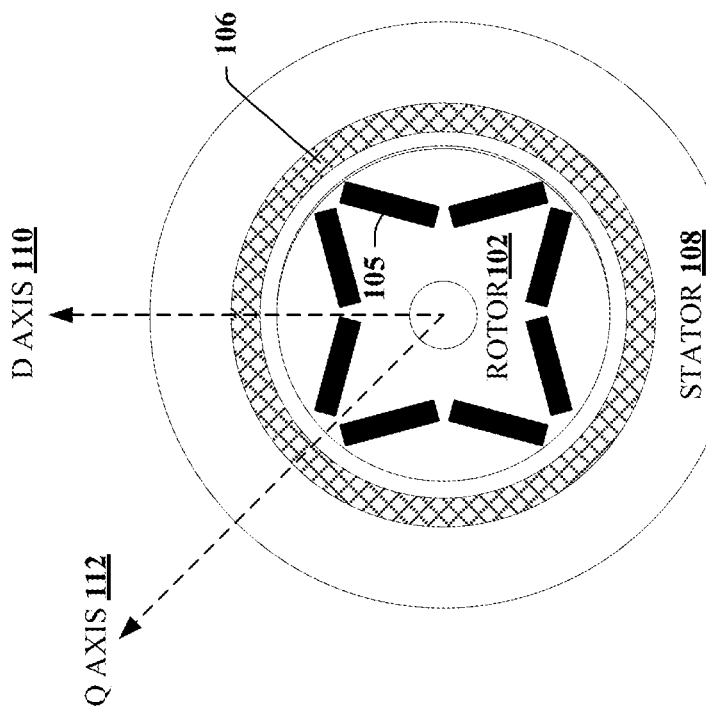
FIG. 1 illustrates diagrams showing lateral axis perspective views of two types of motors are presented in accordance with one or more embodiments of the disclosed subject matter.
Figure 1:
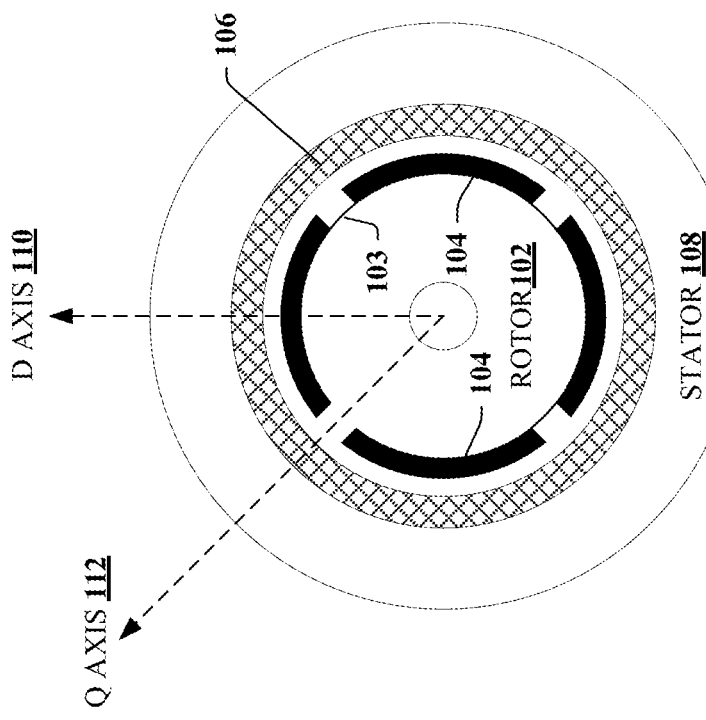

The disclosed subject matter is now described with reference to the drawings, wherein like reference numerals are used to refer to like elements throughout. In the following description, for purposes of explanation, numerous specific details are set forth in order to provide a thorough understanding of the disclosed subject matter. It may be evident, however, that the disclosed subject matter may be practiced without these specific details. In other instances, well-known structures and devices are shown in block diagram form in order to facilitate describing the disclosed subject matter.

Referring now to the drawings, with initial reference to FIG. 1, lateral axis perspective views of two types of motors are presented in accordance with one or more embodiments of the disclosed subject matter. For example, diagram 100A shows an example surface permanent magnet (SPM) motor and diagram 100B shows an example interior permanent magnet (IPM) motor.

As illustrated, both types of motors share many similarities including having a rotor 102, a stator 108, and stator windings 106, which is accentuated by cross-hatches. The two types of motors also have some differences that can result in a different set of advantages/disadvantages such that one motor type may be more useful than the other depending on the application. In regard to these differences, the SPM motor has one or more permanent magnets 104 coupled to an outer surface 103 of rotor 102. In contrast, the IPM motor has one or more permanent magnets 105 embedded inside rotor 102.

In some embodiments, two axes are used for controlling a given motor. One of these axes is referred to as D axis 110 and the other is referred to as Q axis 112. D axis 110 can represent a boundary of a magnetic pole. Q axis 112 can represent a center of the magnetic pole. Typically, Q axis 112 has a low magnetic permeability, while D axis 110 has a high magnetic permeability. Hence a torque can be generated due to an inductance difference between the two axes 110, 112. For example, inductance can be generated in response to current being applied to winding coil 106, leading to a torque that can rotate rotor 102.

In the domain of permanent magnet motors, the concept of reluctance is known. Reluctance can be thought of as a resistance or opposition to magnetic flux and is defined as the ratio of magnetomotive force to magnet flux. Another distinction between SPM motors and IPM motors is that IPM motors produce reluctance and magnetic torque whereas SPM motors typically do not produce reluctance torque.

Example PM Motors Having Ferromagnetic Core Element

Figure 2:
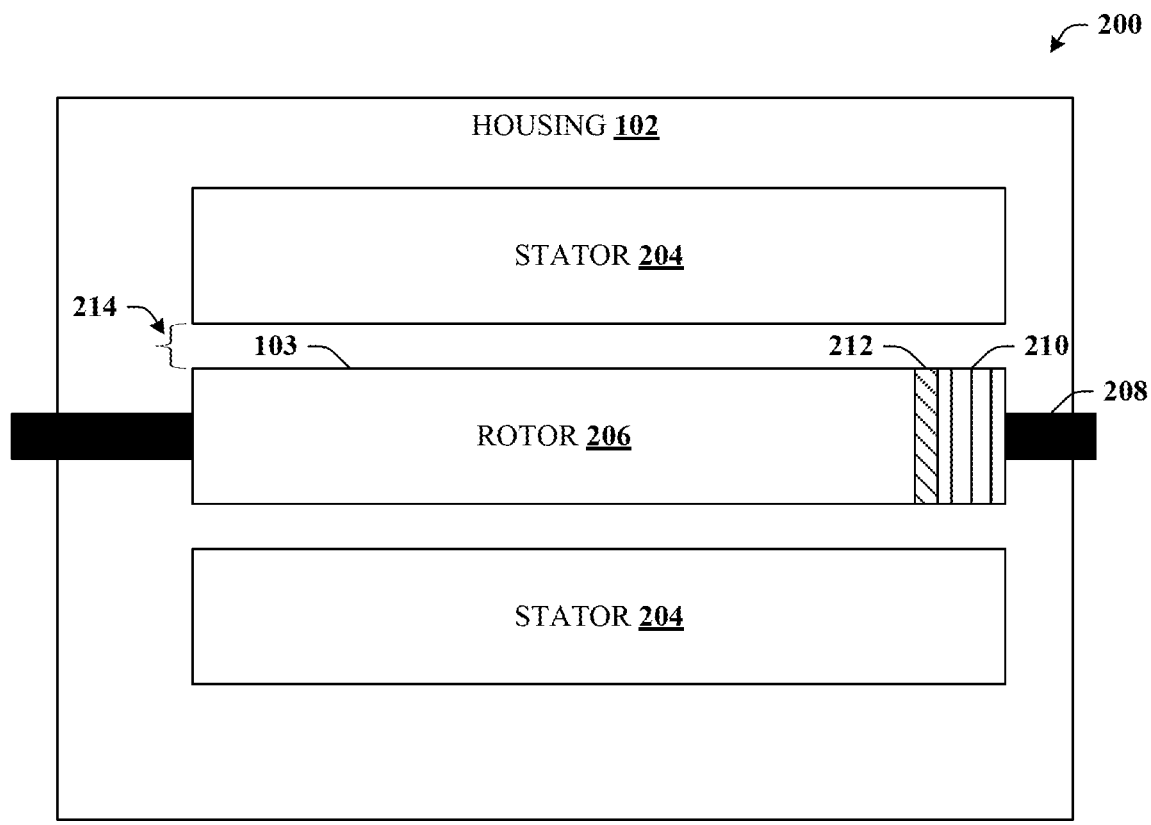
FIG. 2 illustrates a block diagram of an example non-limiting PM motor with a ferromagnetic core element, which can cause a non-torque producing reluctance path to a shaft in accordance with one or more embodiments of the disclosed subject matter.

With reference now to FIG. 2, a block diagram of an example non-limiting PM motor 200 with a ferromagnetic core element, which can cause a (non-torque producing) reluctance path to a shaft in accordance with one or more embodiments of the disclosed subject matter. It should be understood that in the discussion of the present embodiment and of embodiments to follow, repetitive description of like elements employed in the various embodiments described herein is omitted for sake of brevity. While FIG. 1 was illustrated according to an axis perspective, FIG. 2 and subsequent figures illustrate the apparatus from a cross-section view. In some embodiments, PM motor 200 can be an SPM motor. In some embodiments, PM motor 200 can be an IPM motor. In some embodiments, PM motor 200 can be, e.g., part of an HVAC device such as a compressor apparatus.

The PM motor 200 can comprise housing 102. Within housing 102 can reside all or portions of stator 204, rotor 206, and shaft 208. While not expressly shown in this view, it is appreciated that permanent magnets 104 (e.g., for SPM embodiments) can be coupled to outer surface 103 of rotor 206 and can be situated between rotor 206 and stator 204, as illustrated at diagram 100A of FIG. 1. In other embodiments (e.g., IPM embodiments), permanent magnets 105 can be situated within an interior of rotor 206, as illustrated at diagram 100B. Thus, permanent magnets 104, 105 can rotate in unison with rotor 206 and shaft 208, for example, in response to current being applied to stator windings 106 (not shown, but see FIG. 1).

The PM motor 200 can further comprise core element 210, accentuated with vertical lines. Core element 210 can be composed of a ferromagnetic material such as iron or another suitable material, or suitable alloys or composites thereof. Core element 210 can be configured to cause a reluctance path to shaft 208 during operation of the PM motor 200.

It is appreciated that core element 210 can provide an additional non-torque-producing path for magnetic reluctance to flow. Such can result in a decrease in overall reluctance and an increase in the overall inductance apparent at motor terminals. A higher overall inductance can reduce current ripple and can further result in a lower total harmonic distortion, reduced power loss, and reduced heat generated, e.g., inside rotor 206.

Core element 210 and/or associated core material can be physically placed in many different arrangements, which can be adapted according to implementation or a desired result. Various additional non-limiting examples of the different potential arrangements are further detailed below with reference to subsequent figures. In some embodiments, arrangement of core element(s) 210 can be designed or determined to provide a non-torque-producing reluctance path, noted above.

In some embodiments, PM motor 200 can further comprise flux barrier 212, which is accentuated with diagonal lines. Flux barrier 212 can be situated between core element 210 and rotor 206. Flux barrier 212 can be configured to prevent or mitigate a magnetic flux from flowing directly to core element 210 and/or "shorting out" permanent magnets 104, 105. Rather, flux barrier 212 can cause the magnetic flux to travel to shaft 208, e.g., in substantially radial paths.

Figure 3:
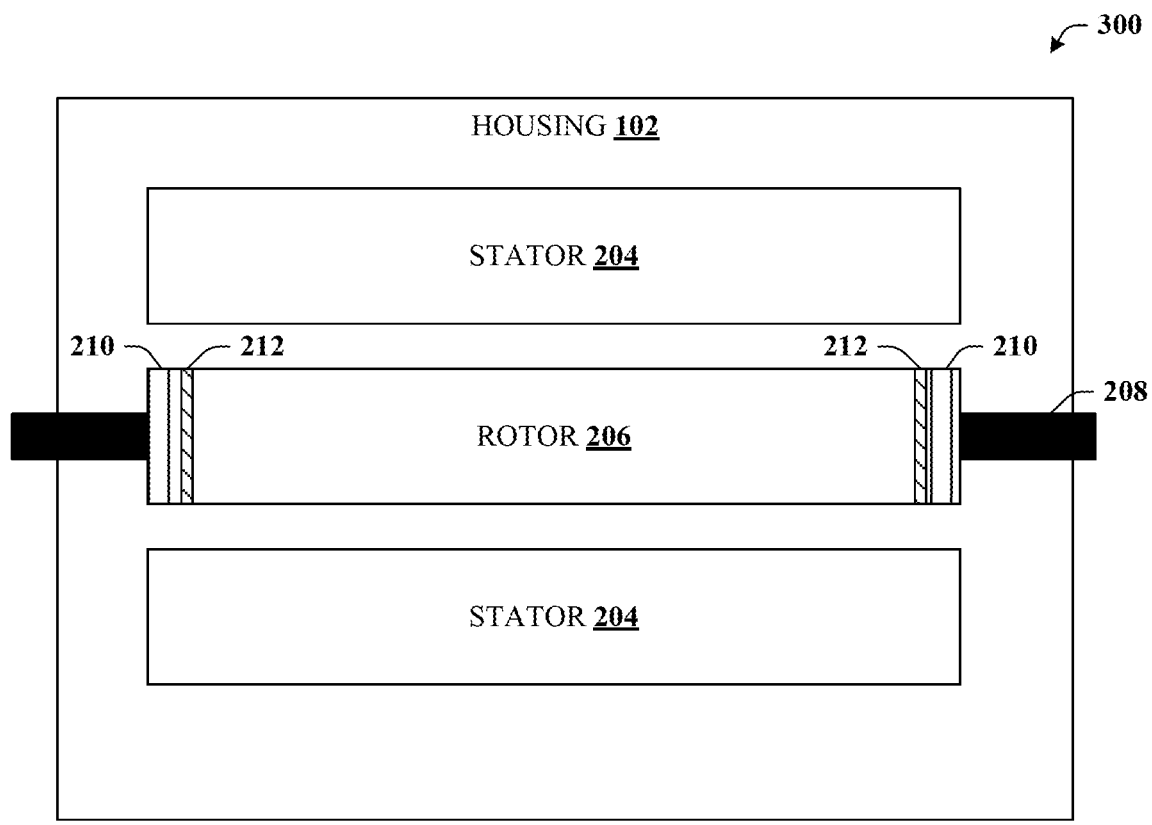
FIG. 3 illustrates a second non-limiting example of an PM motor having a core element coupled to the shaft in accordance with one or more embodiments of the disclosed subject matter.

In some embodiments, core element 210 can be coupled to shaft 210, non-limiting examples of which are provided at FIGS. 2 and 3. In some embodiments, core element 210 can be coupled to stator 204, non-limiting examples of which are provided at FIGS. 4A-4C. In the instant example, core element 210 and flux barrier 212 can be coupled to shaft 208 and can be shaped as a cylinder, disc, toroid, or the like with an interior opening through which shaft 208 extends.

It is appreciated that SPM motors tend operate with low inductance values relative to their IPM motor counterparts. This low inductance characteristic is due in part to having a significant air gap illustrated by reference numeral 214. As noted previously, permanent magnets 104 can be mounted within air gap 214, and a thickness of permanent magnets 104 counts as air gap 214 in that regard.

By adding core element 210, an extra reluctance path can be provided. As a result, inductance can be increased to a value similar to Lq in IPM motors. ILq can represent a reluctance path around the magnets. With core element 210 in place, an inductor (e.g., a signal filter inductor such as inductor 404 detailed with respect to FIG. 4) can saturate at high current. This inductor can saturate on both Ld and Lq axes (e.g., axes 110 and 112 of FIG. 1).

FIG. 3 illustrates a second non-limiting example of an PM motor 300 having a core element coupled to the shaft in accordance with one or more embodiments of the disclosed subject matter. In this example, multiple groups of core elements 210 and corresponding flux barriers 212 are depicted, each group on opposing sides of rotor 206. As illustrated, in this embodiment, physical sizes of each contributing core element 210 and/or flux barrier can be smaller in terms of width or another suitable dimension.

Figure 4A:
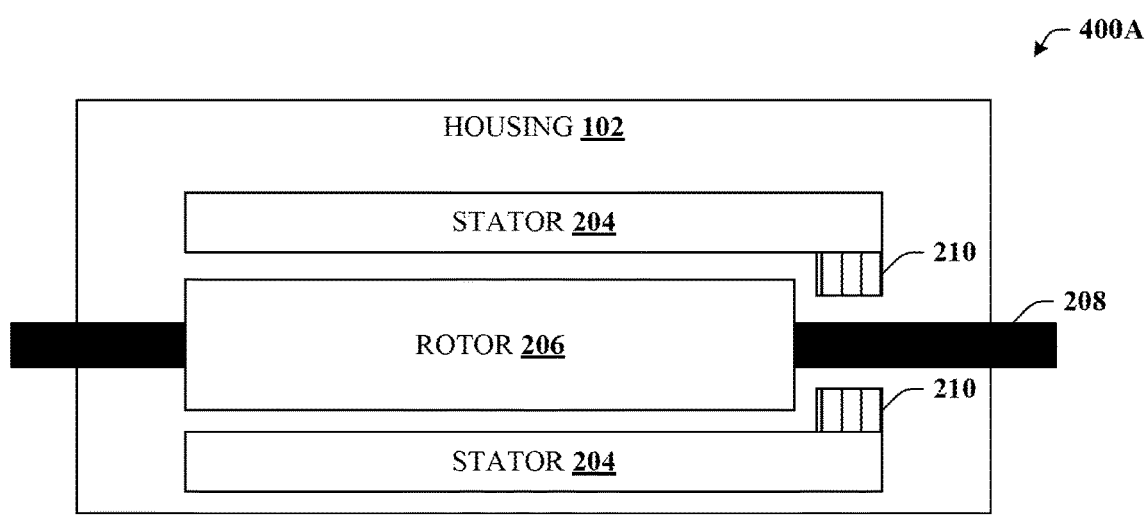
FIGS. 4A-4C illustrate various non-limiting examples of PM motors having one or more core elements coupled to the stator in accordance with one or more embodiments of the disclosed subject matter.
Figure 4B:
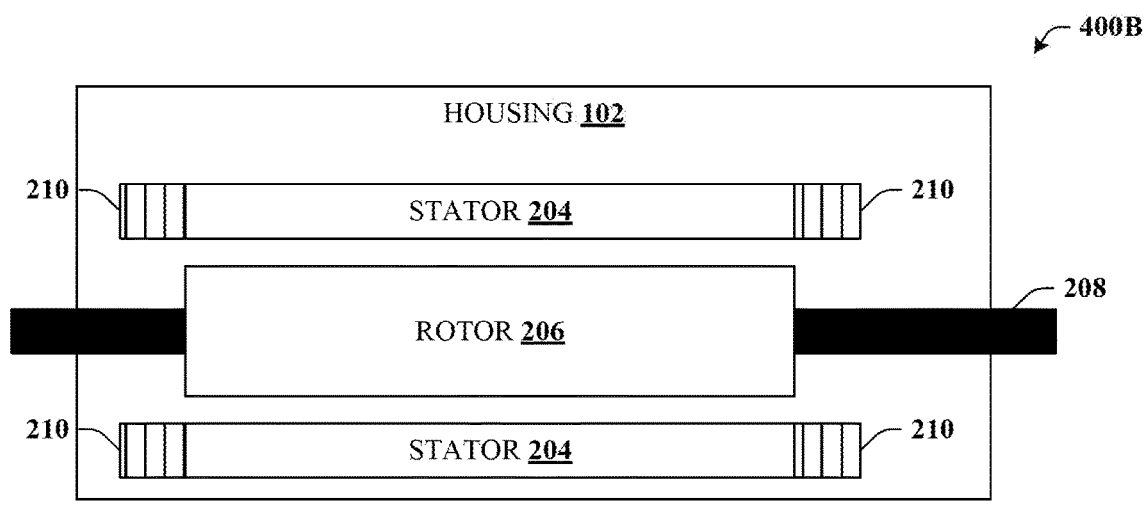
Figure 4C:
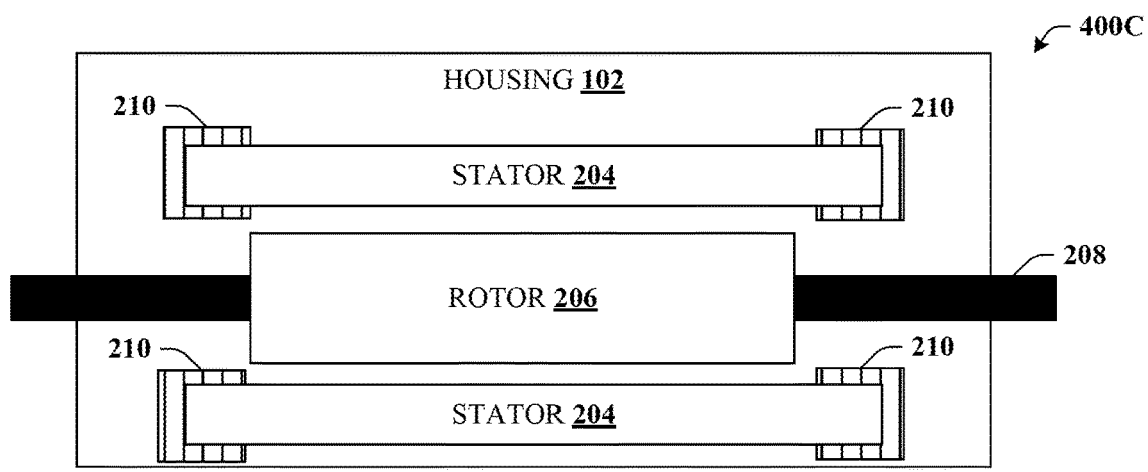

Turning now to FIGS. 4A-4C, various non-limiting examples of PM motors 400A-400C having one or more core elements coupled to the stator in accordance with one or more embodiments of the disclosed subject matter. In some embodiments, flux barrier 212 may or may not be included. FIG. 4A illustrates PM motor 400A having core element 210 situated between stator 204 and shaft 208. For example, core element 210 can be shaped as a disc or hollowed-out cylinder with an outer surface coupled to or in contact with stator 204 and an inner surface some distance away from shaft 208.

FIG. 4B illustrates PM motor 400B having core elements 210 coupled to or in contact with opposing sides of stator 204. Once more, core elements 210 can be shaped as a disc or hollowed-out cylinder. In this case, the inner surface of core elements 210 may be a greater distance from shaft 208. FIG. 4C illustrates PM motor 400C having core elements 210 coupled to or in contact with opposing sides of stator 204, effectively lining the outer portions of stator 204.

Example PM Motor Having Integrated Filter

It is appreciated that high speed permanent magnet motors (e.g., SPM motors or IPM motors detailed herein) typically have low inductance in operation. A pulse width modulation (PWM) inverter operating in conjunction low inductance can cause a significant amount of harmonic current distortion, which leads to significant heating of the PM motor.

To illustrate, consider a traditional experience with an SPM motor in which F-PWM=12×F-power. To give a concrete example, consider a two-pole, 50 krpm motor. Based on the above, results can be as follows: F-power=833 Hz and F-PWM=10 kHz. Motor suppliers prefer to have motor total harmonic current distortion (THDi) below about 5%. Simulations for that example motor illustrate that in order to achieve 5% THDi, the PWM frequency needs to be about 13 KHz. Higher PWM frequency means greater loss for a variable frequency drive (VFD), which leads to derating and/or more expensive VFD. Higher THDi in a motor means more heat. However, this heat can be managed with more cooling.

For example, other systems add external filters in order to decrease total harmonic current distortion. In other words, external filters can decrease total harmonic current distortion, which in turn decreases the amount of heat generated by the PM motor. However, external filters are extremely expensive.

Figure 5:
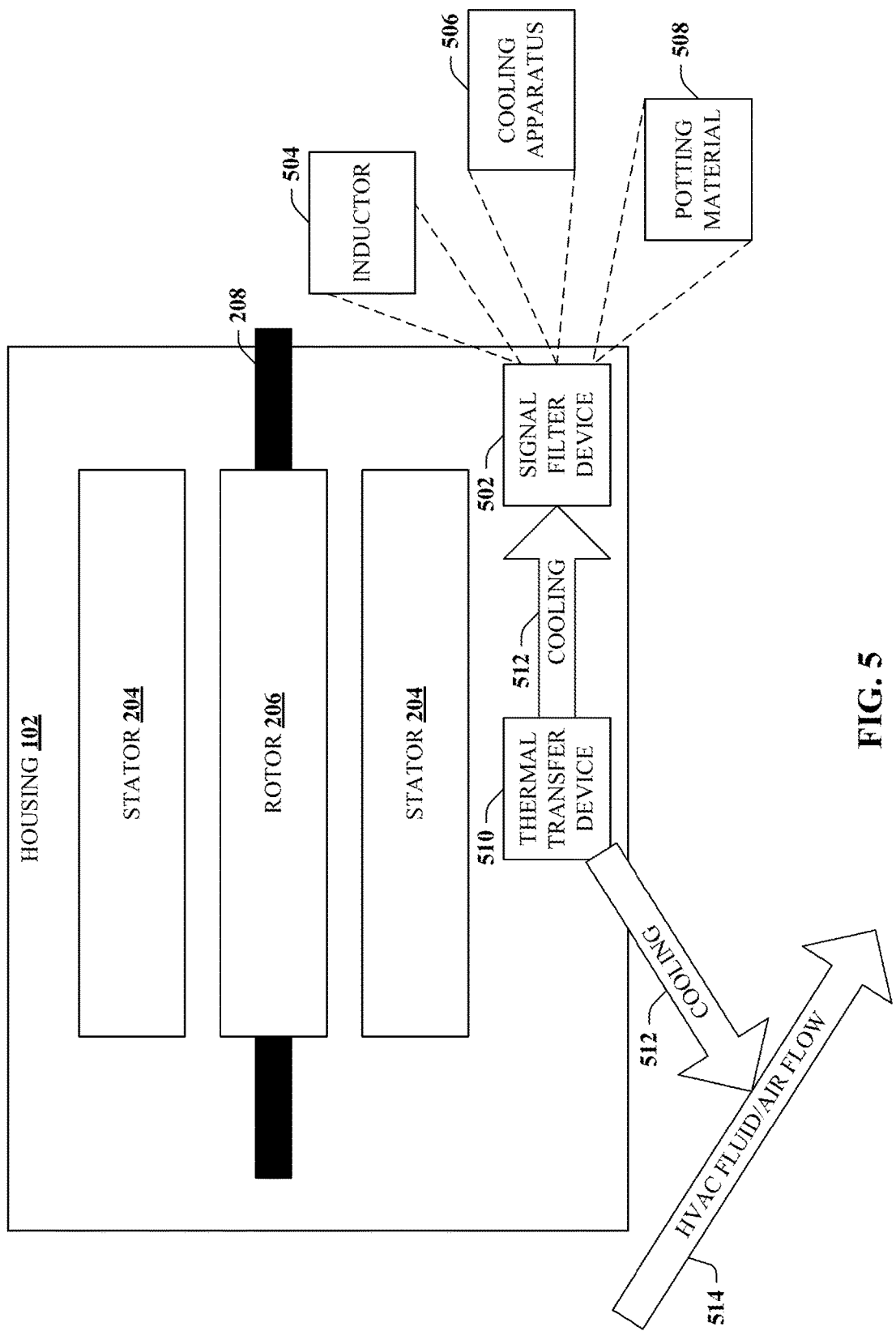
FIG. 5 illustrates a block diagram of an example non-limiting PM motor with an integrated signal filter device in accordance with one or more embodiments of the disclosed subject matter.

Turning now to FIG. 5, a block diagram of an example non-limiting PM motor 500 with an integrated signal filter device in accordance with one or more embodiments of the disclosed subject matter. In other words, instead of relying on an external signal filter, PM motor 500 can utilize a signal filter device 502 that is internal to housing 102 of PM motor 500. As illustrated, signal filter device can include, inter alia, inductor 504 (e.g., a toroidal inducator, etc.), cooling apparatus 506 (e.g., lines for refrigerant, etc.), and potting material 508, all or significant portions of which can be entirely included in housing 102.

By integrating signal filter device 502 inside PM motor 500, costs can be reduced and other advantages can be realized. For example, by integrating signal filter device 502 inside PM motor 500, an amount of wiring can be reduced, which can result in less labor and less material cost due to, e.g., fewer wires, lugs, etc. and reduced panel space or the like. Furthermore, complex packaging typically utilized for inductors of external signal filters can be eliminated. It is observed that a wire size inside PM motor 500 can be significantly smaller than flexibar/cable size for external filters, which can yield further savings. Moreover, certain connectors, external inductor housing, external inductor cooling design, external potting material, and a need for a separate liquid cooling circuit can be eliminated.

In that regard, external filters that are cooled via refrigerant rely on a separate cooling device. By integrating signal filter device 502 inside PM motor 500, a same cooling apparatus that is utilized by an associated HVAC device (e.g., a compressor, etc.) can perform double duty by cooling signal filter device as well. For example, thermal transfer device 510 can be configured to perform cooling procedure 512 that removes heat from signal filter device 502 and removes heat from an HVAC air flow 514. For example, refrigerant lines can run from internal portions of thermal transfer device 510 to signal filter device 502, which can be included in housing 102. In addition, the same or other lines can run to one or more cooling blocks that are, for example, situated in a duct or the like.

Example PM Motor Having Inductors on Shaft

Figure 6:
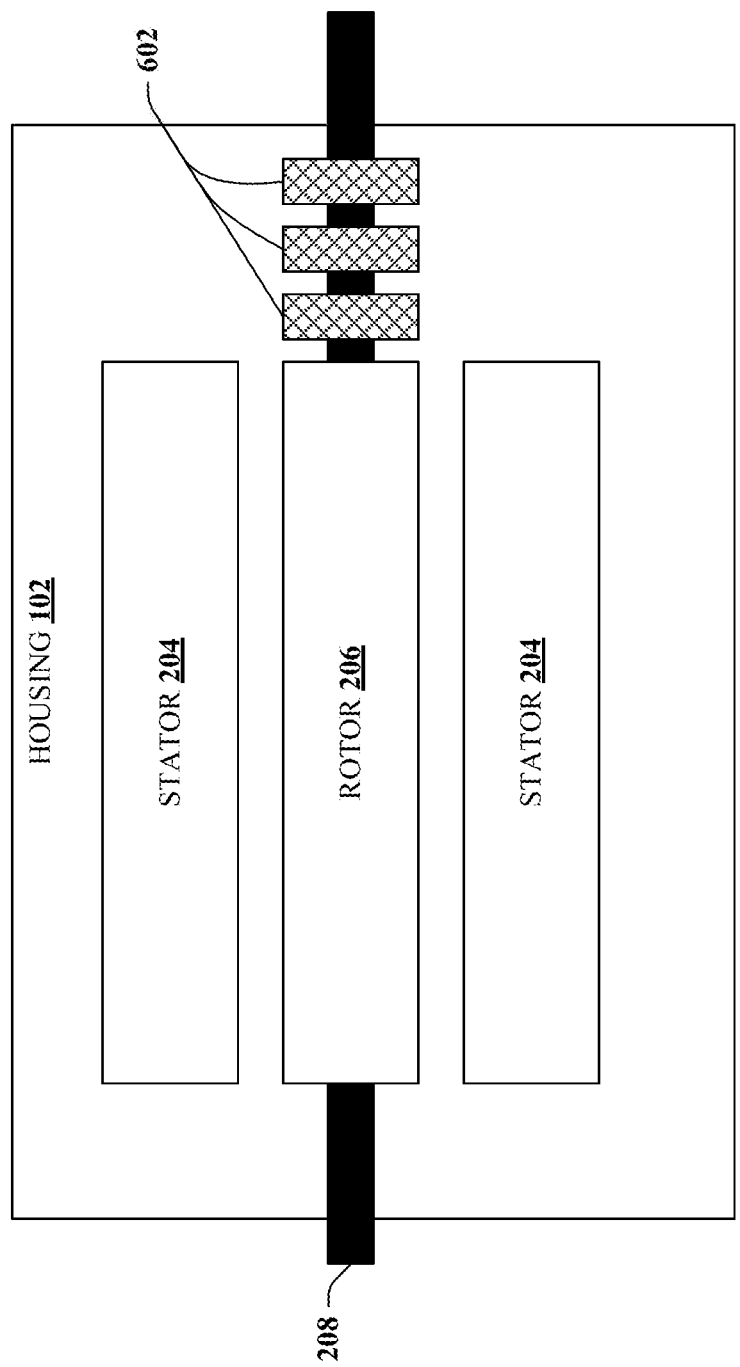
FIG. 6 illustrates a block diagram of an example non-limiting PM motor with inductors mounted around the shaft in accordance with one or more embodiments of the disclosed subject matter.

With reference now to FIG. 6, a block diagram of an example non-limiting PM motor 600 with inductors mounted around the shaft in accordance with one or more embodiments of the disclosed subject matter. As depicted, inductors 602 (shown with cross-hatch) can be coupled to shaft 208. As such, inductors 602 can rotate or spin at high speeds along with shaft 208. Such rotation can operate to aid in cooling inductors 602.

In some embodiments, inductors 602 can be shaped as toroids with shaft 208 extending through a central opening of inductors 602. In some embodiments, inductors 602 can be mounted on one or more core element(s) 210. In some embodiments, inductors 602 can be inductors 504 of signal filter device 502, which tend to generate significant amounts of heat from THDi and so forth. Hence, rotation of shaft 602 during operation can mitigate heat build up to a significant degree.

Example Methods of Fabricating an PM Motor

Figure 7:
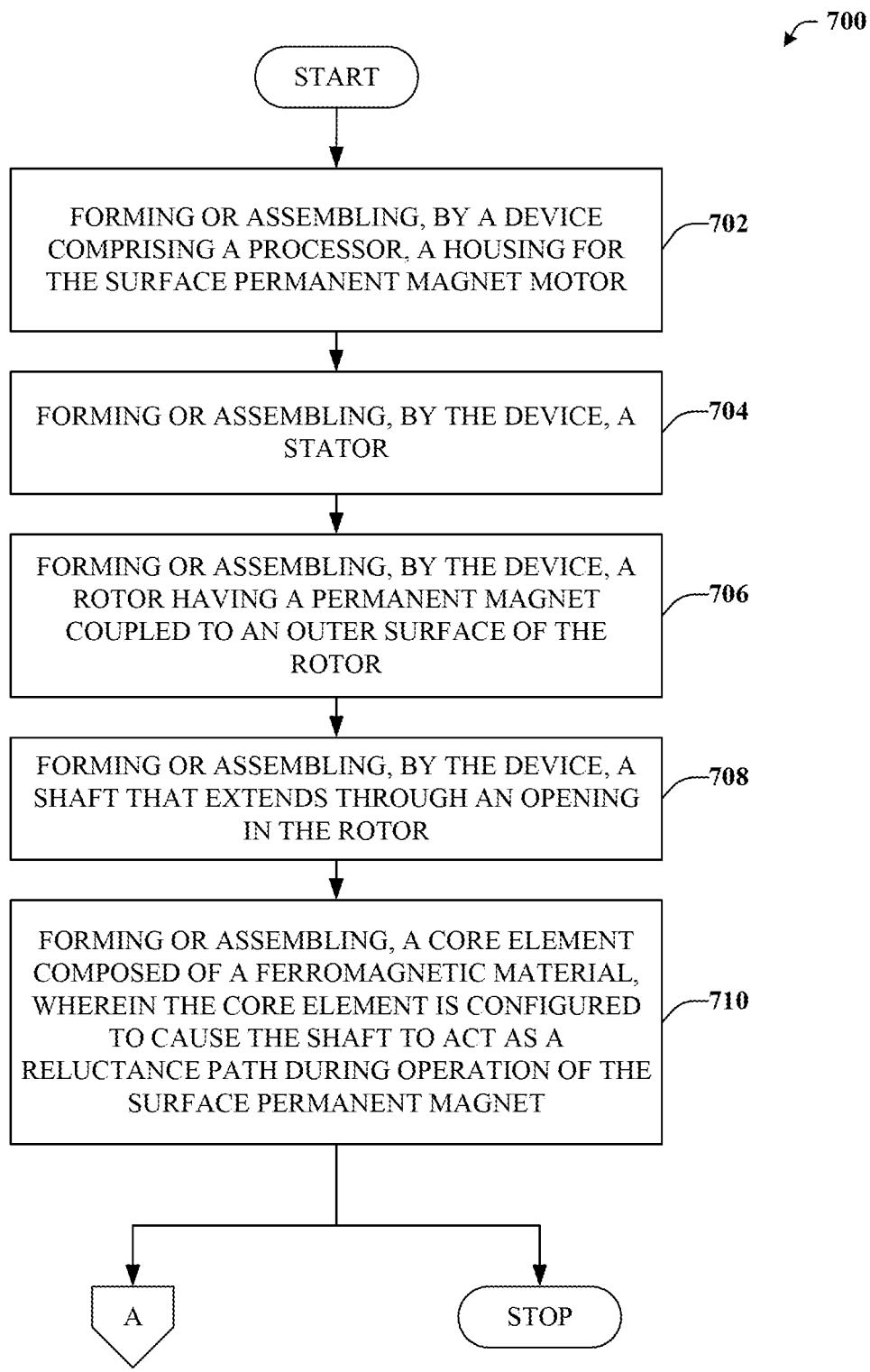
FIG. 7 illustrates a flow diagram of an example, non-limiting method for fabricating a permanent magnet motor in accordance with one or more embodiments of the disclosed subject matter.
Figure 8:
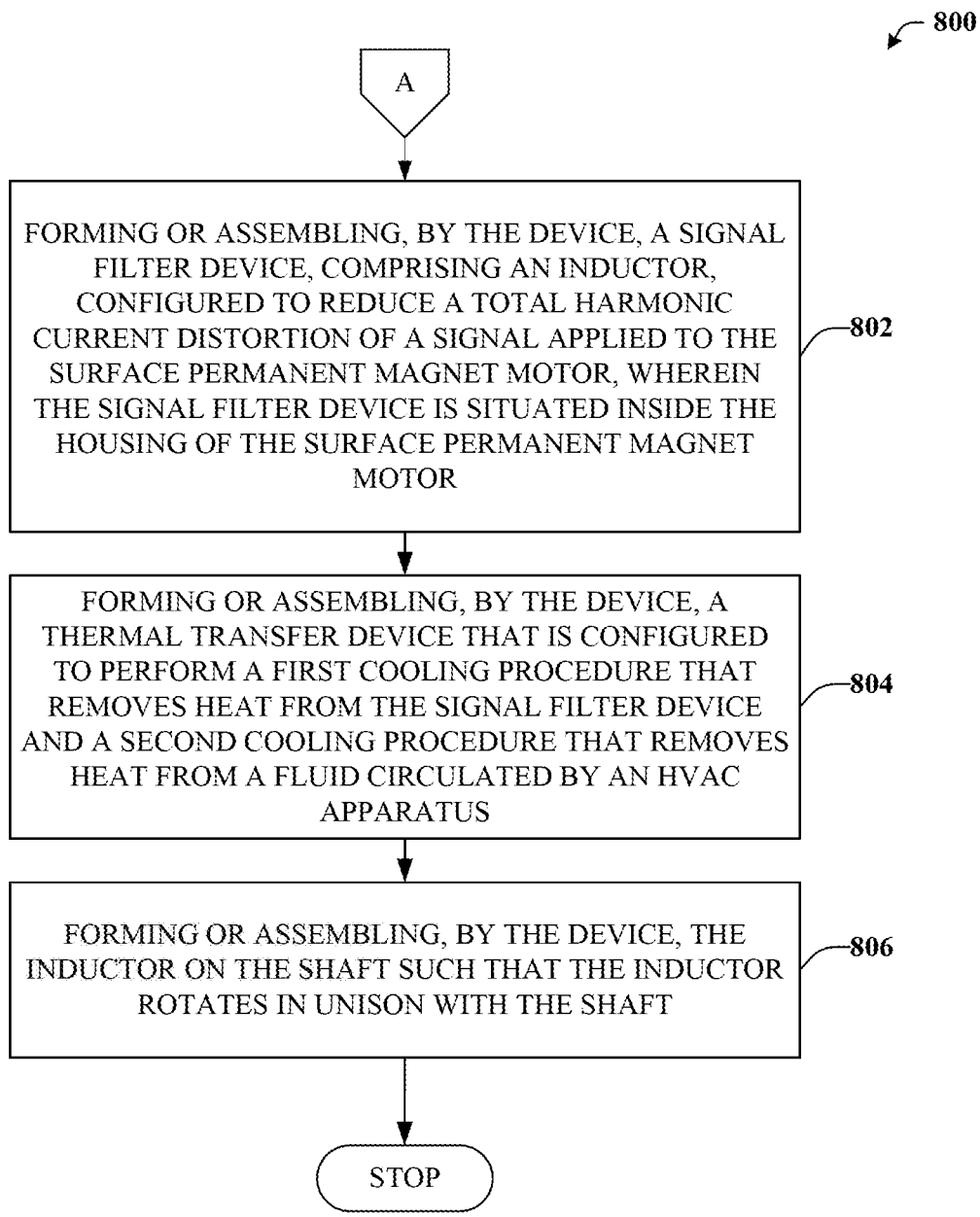
FIG. 8 illustrates a flow diagram of an example, non-limiting method that can provide additional aspects or elements in connection with fabricating a PM motor in accordance with one or more embodiments of the disclosed subject matter.

FIGS. 7 and 8 illustrate various methodologies in accordance with the disclosed subject matter. While, for purposes of simplicity of explanation, the methodologies are shown and described as a series of acts, it is to be understood and appreciated that the disclosed subject matter is not limited by the order of acts, as some acts can occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts can be required to implement a methodology in accordance with the disclosed subject matter. Additionally, it should be further appreciated that the methodologies disclosed hereinafter and throughout this specification are capable of being stored on an article of manufacture to facilitate transporting and transferring such methodologies to computers.

FIG. 7 illustrates a flow diagram 700 of an example, non-limiting method for fabricating a permanent magnet motor in accordance with one or more embodiments of the disclosed subject matter. For example, at reference numeral 702, a device comprising a processor can perform certain operations. Examples of said processor as well as other suitable computer or computing-based elements, can be found with reference to FIG. 9, and can be used in connection with implementing one or more of the devices or components shown and described in connection with figures disclosed herein. The device comprising the processor can facilitate forming or assembling a housing for the permanent magnet motor.

At reference numeral 704, the device can facilitate forming or assembling a stator. At reference numeral 706, the device can facilitate forming or assembling a rotor. Such can comprising forming or assembling one or more permanent magnets coupled to an outer surface of the rotor (or within an interior of the rotor for IPM implementations). At reference numeral 708, the device can facilitate forming or assembling a shaft that extends through an opening in the rotor.

At reference numeral 710, the device can facilitate forming or assembling a core element composed of a ferromagnetic material. The core element can be configured to cause the shaft to act as a reluctance path during operation of the permanent magnet. Method 700 can proceed to insert A, which is further detailed in connection with FIG. 8, or terminate.

Turning now to FIG. 8, illustrated is a flow diagram 800 of an example, non-limiting method that can provide additional aspects or elements in connection with fabricating an PM motor in accordance with one or more embodiments of the disclosed subject matter.

At reference numeral 802, the device can facilitate forming or assembling a signal filter device. The signal filter device can comprise, e.g., an inductor. The inductor can be configured to reduce a total harmonic current distortion of a pulse width modulation signal. The inductor, and other portions of the signal filter device can be situated inside the housing of the permanent magnet motor.

At reference numeral 804, the device can facilitate forming or assembling a thermal transfer device. The thermal transfer device can be configured to perform a first cooling procedure that removes heat from the signal filter device and a second cooling procedure that removes heat from a fluid circulated by an HVAC apparatus.

At reference numeral 806, the device can facilitate assembling or forming the inductor on the shaft such that the inductor rotates in unison with the shaft. Thus, the inductor can be cooled as a result of rotation in addition to other cooling techniques.

Example Operating Environments

Figure 9:
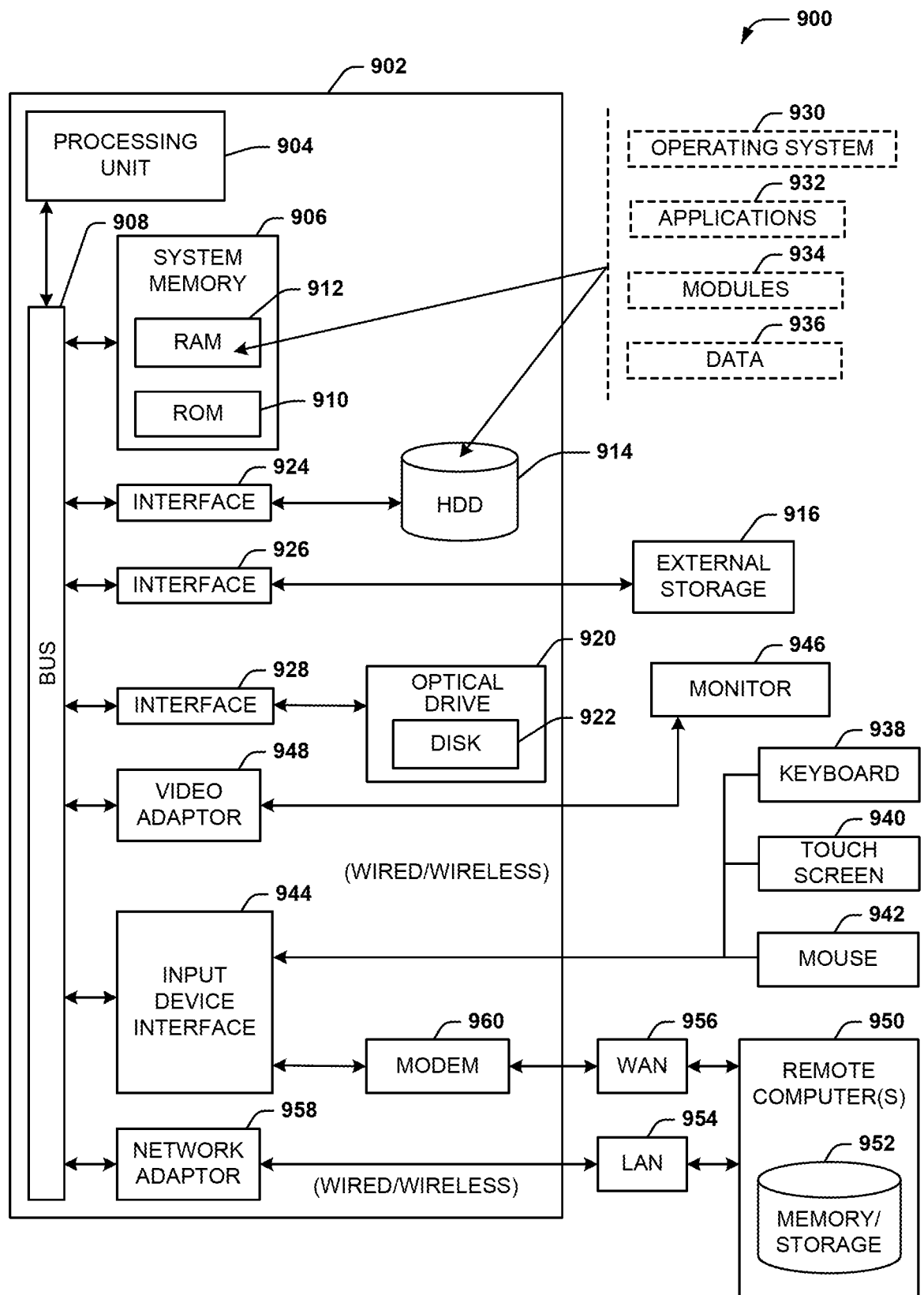
FIG. 9 illustrates a block diagram of an example, non-limiting operating environment in which one or more embodiments described herein can be facilitated.

In order to provide additional context for various embodiments described herein, FIG. 9 and the following discussion are intended to provide a brief, general description of a suitable computing environment 900 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 9, the example environment 900 for implementing various embodiments of the aspects described herein includes a computer 902, the computer 902 including a processing unit 904, a system memory 906 and a system bus 908. The system bus 908 couples system components including, but not limited to, the system memory 906 to the processing unit 904. The processing unit 904 can be any of various commercially available processors. Dual microprocessors and other multi-processor architectures can also be employed as the processing unit 904.

The system bus 908 can be any of several types of bus structure that can further interconnect to a memory bus (with or without a memory controller), a peripheral bus, and a local bus using any of a variety of commercially available bus architectures. The system memory 906 includes ROM 910 and RAM 912. A basic input/output system (BIOS) can be stored in a non-volatile memory such as ROM, erasable programmable read only memory (EPROM), EEPROM, which BIOS contains the basic routines that help to transfer information between elements within the computer 902, such as during startup. The RAM 912 can also include a high-speed RAM such as static RAM for caching data.

The computer 902 further includes an internal hard disk drive (HDD) 914 (e.g., EIDE, SATA), one or more external storage devices 916 (e.g., a magnetic floppy disk drive (FDD) 916, a memory stick or flash drive reader, a memory card reader, etc.) and an optical disk drive 920 (e.g., which can read or write from a CD-ROM disc, a DVD, a BD, etc.). While the internal HDD 914 is illustrated as located within the computer 902, the internal HDD 914 can also be configured for external use in a suitable chassis (not shown). Additionally, while not shown in environment 900, a solid state drive (SSD) could be used in addition to, or in place of, an HDD 914. The HDD 914, external storage device(s) 916 and optical disk drive 920 can be connected to the system bus 908 by an HDD interface 924, an external storage interface 926 and an optical drive interface 928, respectively. The interface 924 for external drive implementations can include at least one or both of Universal Serial Bus (USB) and Institute of Electrical and Electronics Engineers (IEEE) 994 interface technologies. Other external drive connection technologies are within contemplation of the embodiments described herein.

The drives and their associated computer-readable storage media provide nonvolatile storage of data, data structures, computer-executable instructions, and so forth. For the computer 902, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 912, including an operating system 930, one or more application programs 932, other program modules 934 and program data 936. All or portions of the operating system, applications, modules, and/or data can also be cached in the RAM 912. The systems and methods described herein can be implemented utilizing various commercially available operating systems or combinations of operating systems.

Computer 902 can optionally comprise emulation technologies. For example, a hypervisor (not shown) or other intermediary can emulate a hardware environment for operating system 930, and the emulated hardware can optionally be different from the hardware illustrated in FIG. 9. In such an embodiment, operating system 930 can comprise one virtual machine (VM) of multiple VMs hosted at computer 902. Furthermore, operating system 930 can provide runtime environments, such as the Java runtime environment or the .NET framework, for applications 932. Runtime environments are consistent execution environments that allow applications 932 to run on any operating system that includes the runtime environment. Similarly, operating system 930 can support containers, and applications 932 can be in the form of containers, which are lightweight, standalone, executable packages of software that include, e.g., code, runtime, system tools, system libraries and settings for an application.

Further, computer 902 can be enable with a security module, such as a trusted processing module (TPM). For instance with a TPM, boot components hash next in time boot components, and wait for a match of results to secured values, before loading a next boot component. This process can take place at any layer in the code execution stack of computer 902, e.g., applied at the application execution level or at the operating system (OS) kernel level, thereby enabling security at any level of code execution.

A user can enter commands and information into the computer 902 through one or more wired/wireless input devices, e.g., a keyboard 938, a touch screen 940, and a pointing device, such as a mouse 942. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 904 through an input device interface 944 that can be coupled to the system bus 908, but can be connected by other interfaces, such as a parallel port, an IEEE 1394 serial port, a game port, a USB port, an IR interface, a BLUETOOTH® interface, etc.

A monitor 946 or other type of display device can be also connected to the system bus 908 via an interface, such as a video adapter 948. In addition to the monitor 946, a computer typically includes other peripheral output devices (not shown), such as speakers, printers, etc.

The computer 902 can operate in a networked environment using logical connections via wired and/or wireless communications to one or more remote computers, such as a remote computer(s) 950. The remote computer(s) 950 can be a workstation, a server computer, a router, a personal computer, portable computer, microprocessor-based entertainment appliance, a peer device or other common network node, and typically includes many or all of the elements described relative to the computer 902, although, for purposes of brevity, only a memory/storage device 952 is illustrated. The logical connections depicted include wired/wireless connectivity to a local area network (LAN) 954 and/or larger networks, e.g., a wide area network (WAN) 956. Such LAN and WAN networking environments are commonplace in offices and companies, and facilitate enterprise-wide computer networks, such as intranets, all of which can connect to a global communications network, e.g., the Internet.

When used in a LAN networking environment, the computer 902 can be connected to the local network 954 through a wired and/or wireless communication network interface or adapter 958. The adapter 958 can facilitate wired or wireless communication to the LAN 954, which can also include a wireless access point (AP) disposed thereon for communicating with the adapter 958 in a wireless mode.

When used in a WAN networking environment, the computer 902 can include a modem 960 or can be connected to a communications server on the WAN 956 via other means for establishing communications over the WAN 956, such as by way of the Internet. The modem 960, which can be internal or external and a wired or wireless device, can be connected to the system bus 908 via the input device interface 944. In a networked environment, program modules depicted relative to the computer 902 or portions thereof, can be stored in the remote memory/storage device 952. It will be appreciated that the network connections shown are example and other means of establishing a communications link between the computers can be used.

When used in either a LAN or WAN networking environment, the computer 902 can access cloud storage systems or other network-based storage systems in addition to, or in place of, external storage devices 916 as described above. Generally, a connection between the computer 902 and a cloud storage system can be established over a LAN 954 or WAN 956 e.g., by the adapter 958 or modem 960, respectively. Upon connecting the computer 902 to an associated cloud storage system, the external storage interface 926 can, with the aid of the adapter 958 and/or modem 960, manage storage provided by the cloud storage system as it would other types of external storage. For instance, the external storage interface 926 can be configured to provide access to cloud storage sources as if those sources were physically connected to the computer 902.

The computer 902 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration and are intended to be non-limiting. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random-access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus, comprising:
    a housing of a permanent magnet motor, comprising:
        a stator;
        a rotor;
        a permanent magnet coupled to an outer surface of the rotor and situated between the stator and the rotor;
        a shaft, extending through an opening in the rotor, that rotates in unison with the rotor;
        a core element composed of a ferromagnetic material, wherein the core element is configured to cause a reluctance path to the shaft during operation of the permanent magnet motor; and
        a flux barrier situated between the core element and the rotor.

2. The apparatus of claim 1, wherein the ferromagnetic material is iron.

3. The apparatus of claim 1, wherein the core element is coupled to the shaft.

4. The apparatus of claim 1, wherein the core element is coupled to the stator.

5. The apparatus of claim 1, wherein the core element has a shape that is one of a group comprising: a disc, a toroidal, and a cylinder, with an interior opening through which the shaft extends.

6. The apparatus of claim 1, further comprising a signal filter device, comprising an inductor, configured to reduce a total harmonic current distortion of a pulse width modulation signal.

7. The apparatus of claim 6, wherein the signal filter device is situated inside the housing of the permanent magnet motor.

8. The apparatus of claim 7, further comprising a thermal transfer device that is configured to perform a first cooling procedure that removes heat from the signal filter device.

9. The apparatus of claim 8, wherein the thermal transfer device is configured to perform the first cooling procedure and a second cooling procedure that removes heat from a fluid circulated by a heating, ventilation, air conditioning (HVAC) compressor apparatus.

10. The apparatus of claim 7, wherein the inductor of the signal filter device is configured as a toroid.

11. The apparatus of claim 10, wherein the shaft extends through an interior opening of the toroid.

12. A permanent magnet motor, comprising:
    a housing, comprising:
        a stator;
        a rotor;
        a permanent magnet coupled to the rotor;
        a shaft, extending through an opening of the rotor, that rotates in unison with the rotor;
        a core element comprising a ferromagnetic material, wherein the core element is configured to cause the shaft to act as a reluctance path during operation of the permanent magnet motor; and
        a flux barrier situated between the core element and the rotor.

13. The permanent magnet motor of claim 12, wherein the core element is coupled to the shaft.

14. The permanent magnet motor of claim 12, wherein the core element is coupled to the stator.

15. A method for fabricating a permanent magnet motor, comprising:
    forming or assembling, by a device comprising a processor, a housing for the permanent magnet motor;
    forming or assembling, by the device, a stator;
    forming or assembling, by the device, a rotor having a permanent magnet coupled to an outer surface of the rotor;
    forming or assembling, by the device, a shaft that extends through an opening in the rotor;
    forming or assembling, by the device, a core element composed of a ferromagnetic material, wherein the core element is configured to cause the shaft to act as a reluctance path during operation of the permanent magnet; and
    forming or assembling, by the device, a flux barrier situated between the core element and the rotor.

16. The method of claim 15, further comprising forming or assembling, by the device, a signal filter device, comprising an inductor, configured to reduce a total harmonic current distortion of a pulse width modulation signal, wherein the signal filter device is situated inside the housing of the permanent magnet motor.

17. The method of claim 16, further comprising forming or assembling, by the device, a thermal transfer device that is configured to perform a first cooling procedure that removes heat from the signal filter device and a second cooling procedure that removes heat from a fluid circulated by a heating, ventilation, air conditioning (HVAC) apparatus.

18. The method of claim 16, further comprising forming or assembling, by the device, the inductor on the shaft such that the inductor rotates in unison with the shaft.

* * * * *